(12) United States Patent
Amano

(10) Patent No.: US 8,249,849 B2
(45) Date of Patent: Aug. 21, 2012

(54) POWER SOURCE NETWORK ANALYZING APPARATUS, POWER SOURCE NETWORK ANALYZING METHOD, AND POWER SOURCE NETWORK ANALYZING PROGRAM

(75) Inventor: Yasuo Amano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 657 days.

(21) Appl. No.: 12/320,287

(22) Filed: Jan. 22, 2009

(65) Prior Publication Data

US 2009/0299718 A1 Dec. 3, 2009

(30) Foreign Application Priority Data

May 29, 2008 (JP) ................................. 2008-141402

(51) Int. Cl.
*G06F 17/50* (2006.01)
(52) U.S. Cl. ............... 703/14; 703/13; 703/19; 703/20; 716/100; 716/106; 716/109; 716/119; 716/124; 716/125; 716/127; 716/133
(58) Field of Classification Search .................. 703/13, 703/14, 18, 19, 20; 716/101, 104, 105, 120, 716/124, 125, 100, 106, 109, 119, 127, 133
See application file for complete search history.

(56) References Cited

U.S. PATENT DOCUMENTS

| | | | | | |
|---|---|---|---|---|---|
| 5,629,860 | A | * | 5/1997 | Jones et al. | 716/113 |
| 5,761,076 | A | * | 6/1998 | Miki | 716/113 |
| 5,798,937 | A | * | 8/1998 | Bracha et al. | 716/54 |
| 5,826,215 | A | * | 10/1998 | Garrett et al. | 702/75 |
| 6,080,204 | A | * | 6/2000 | Mendel | 716/103 |
| 6,086,238 | A | * | 7/2000 | Mehrotra et al. | 716/115 |
| 6,324,671 | B1 | * | 11/2001 | Ratzel et al. | 716/103 |
| 6,691,296 | B1 | * | 2/2004 | Nakayama et al. | 716/122 |
| 6,845,346 | B1 | * | 1/2005 | Arunachalam et al. | 703/2 |
| 6,931,613 | B2 | * | 8/2005 | Kauth et al. | 716/115 |
| 7,000,214 | B2 | * | 2/2006 | Iadanza et al. | 716/104 |
| 7,016,794 | B2 | * | 3/2006 | Schultz | 702/64 |
| 7,134,106 | B2 | * | 11/2006 | Huang et al. | 716/105 |
| 7,260,802 | B2 | * | 8/2007 | Ho et al. | 716/123 |
| 7,356,790 | B2 | * | 4/2008 | Maruyama et al. | 716/112 |
| 7,603,641 | B2 | * | 10/2009 | Lin | 716/120 |
| 7,644,381 | B2 | * | 1/2010 | Jandhyala et al. | 716/106 |
| 7,647,566 | B2 | * | 1/2010 | Su | 716/119 |

(Continued)

FOREIGN PATENT DOCUMENTS

JP    2003-233637    8/2003

(Continued)

*Primary Examiner* — David Silver
*Assistant Examiner* — Kibrom Gebresilassie
(74) *Attorney, Agent, or Firm* — Staas & Halsey LLP

(57) ABSTRACT

An area partitioning processing unit equally partitions a power source network analysis object area of an LSI according to the number or size of partitioned areas specified by a user or partitions the power source network analysis object area according to the user's specification. A border processing unit extracts and adds a range-of-influence part of the power source network that can electrically influence a border between the partitioned area partitioned by the area partitioning processing unit and an adjacent power source network area. A modeling processing unit performs processing of resistance modeling of the partitioned area or a correction spot with the range-of-influence part added thereto by the border processing unit. A power source network analyzing processing unit analyzes a resistance model modeled by the modeling processing unit and calculates potential of each via as a current source to a load element.

18 Claims, 6 Drawing Sheets

U.S. PATENT DOCUMENTS

| | | | |
|---|---|---|---|
| 7,818,157 B2* | 10/2010 | Schultz | 703/14 |
| 7,844,435 B2* | 11/2010 | Bowen et al. | 703/13 |
| 8,042,077 B2* | 10/2011 | Fujimori et al. | 716/106 |
| 8,065,649 B2* | 11/2011 | Hetzel et al. | 716/126 |
| 8,104,003 B2* | 1/2012 | Fujimori | 716/106 |
| 2001/0035799 A1* | 11/2001 | Ueno et al. | 333/33 |
| 2003/0229866 A1* | 12/2003 | Allen et al. | 716/5 |
| 2004/0206985 A1* | 10/2004 | Ushiyama | 257/207 |
| 2005/0108667 A1* | 5/2005 | Iadanza et al. | 716/4 |
| 2005/0273739 A1* | 12/2005 | Tohyama | 716/4 |
| 2005/0278679 A1* | 12/2005 | Yaguchi et al. | 716/15 |
| 2006/0005153 A1* | 1/2006 | Maruyama et al. | 716/5 |
| 2006/0036421 A1* | 2/2006 | Sekino et al. | 703/13 |
| 2006/0168551 A1* | 7/2006 | Mukuno | 716/5 |
| 2006/0218514 A1* | 9/2006 | Uchida | 716/5 |
| 2007/0162883 A1* | 7/2007 | Su | 716/13 |
| 2007/0225925 A1* | 9/2007 | Suaya et al. | 702/57 |
| 2007/0226659 A1* | 9/2007 | Suaya et al. | 716/1 |
| 2008/0138576 A1* | 6/2008 | Nozu et al. | 428/138 |
| 2008/0140379 A1* | 6/2008 | Shah et al. | 703/14 |
| 2008/0163138 A1* | 7/2008 | Iwakura et al. | 716/4 |
| 2008/0243461 A1* | 10/2008 | Li et al. | 703/13 |
| 2009/0172618 A1* | 7/2009 | Fujimori et al. | 716/5 |
| 2009/0271156 A1* | 10/2009 | Kageura | 703/1 |
| 2010/0082304 A1* | 4/2010 | Fujimori et al. | 703/1 |

FOREIGN PATENT DOCUMENTS

| | | | |
|---|---|---|---|
| JP | 2004-334654 | * | 11/2004 |
| JP | 2007-052591 | | 3/2007 |

* cited by examiner

POWER SOURCE NETWORK ANALYZING APPARATUS, POWER SOURCE NETWORK ANALYZING METHOD, AND POWER SOURCE NETWORK ANALYZING PROGRAM

CROSS-REFERENCE TO RELATED APPLICATIONS

This application is based upon and claims the benefit of priority of the prior Japanese Patent Application No. 2008-141402, filed on May 29, 2008, the entire contents of which are incorporated herein by reference.

FIELD

An embodiment of the present invention relates to a power source network analyzing apparatus, a power source network analyzing method, and a power source network analyzing program that detect a voltage drop of power source potential caused by resistance of the power source network and analyze whether a voltage to supply a sufficient power source can be applied to each load element at a design stage of an integrated circuit.

BACKGROUND

In recent years, in accordance with a larger scale, finer wiring, an increase in amount of power source wiring, and a lower voltage of an integrated circuit such as an LSI (Large Scale Integration), a power source network analysis is becoming very important at a design stage of the integrated circuit.

The power source network analysis deems network-like power source wiring from a power source to a load element in the integrated circuit as a single electric resistor and analyzes whether a sufficient voltage can be applied to the load element under the influence of a voltage drop due to this electric resistor (hereinafter referred to as an IR drop; The IR drop means the voltage drop according to Ohm's law; "I" represents current and "R" represents resistance).

The power source network analysis uses much memory of a computer at the time of execution of the analysis. Enormousness of analysis execution time causes a lack of computer resources and increases the number of problems not to be analyzed and the number of man-hours required for detection and analysis of a problematic power source network and correction of problematic power source error spots. Therefore, conventionally, various techniques were devised for accurately and efficiently performing the power source network analysis (see Japanese Patent Application Laid-open No. 2003-233637 and Japanese Patent Application Laid-open No. 2007-52591).

However, the above conventional technologies have had the following problems. Namely, a further larger scale and enhanced degree of integration of the circuit are significant in the integrated circuit in recent years. The integrated circuit of the larger scale and with the enhanced degree of integration has wiring for connecting respective load elements inside made finer and more complicated. The integrated circuit has come to be designed to achieve the lower voltage to restrain power consumption. Under such circumstances, it is becoming difficult for the above conventional technologies to perform the power source network analysis of the integrated circuit accurately and efficiently.

SUMMARY

According to an aspect of an embodiment, a power source network analyzing apparatus includes an analysis object area partitioning processing unit that, based on design information of an integrated circuit, partitions a power source network analysis object area of the integrated circuit into partitioned power source network analysis object areas; an adjacent border area extracting and adding processing unit that extracts a border adjacent area electrically influencing the partitioned power source network analysis object area partitioned by the analysis object area partitioning processing unit and adds the border adjacent area to the partitioned power source network analysis object area; a resistance model generating processing unit that generates a resistance model of the partitioned power source network analysis object area with the border adjacent area added thereto by the adjacent border area extracting and adding processing unit; and a power source network analyzing processing unit that performs power source network analyzing processing on the resistance model generated by the resistance model generating processing unit.

According to another aspect of an embodiment, a power source network analyzing method includes partitioning, based on design information of an integrated circuit, a power source network analysis object area of the integrated circuit into partitioned power source network analysis object areas; extracting a border adjacent area electrically influencing the partitioned power source network analysis object area; adding the border adjacent area to the partitioned power source network analysis object area; generating a resistance model of the partitioned power source network analysis object area with the border adjacent area added thereto; and performing power source network analyzing processing on the generated resistance model.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT

An embodiment of the invention will now be described in detail of a power source network analyzing apparatus, a power source network analyzing method, and a power source network analyzing program with reference to the accompanying drawings. In the following embodiment, an integrated circuit is assumed to be an LSI to be designed using a CAD device.

In the following embodiment, the power source network analyzing apparatus is assumed to be an apparatus separate from the CAD device or a separate program running on a same computer. However, the power source network analyzing apparatus is not limited to this but may be an apparatus integrated with the CAD device, as an apparatus providing an additional function of the CAD device. The power source network analyzing program may be a program operating in cooperation with a CAD program, as an integrated program providing an additional function of the CAD program.

Generally, since the power source network of the LSI is complicated, the wiring is so arranged as to be divided among a plurality of layers. A part that connects wiring on an upper layer and wiring on a lower layer is referred to as a "via". An uppermost layer has a power supplying unit to which the voltage is applied by the power source.

A lowermost layer has the via connected thereto that supplies current that, by the voltage applied by the power supplying unit on the uppermost layer, flows by way of the wiring on each layer and the via connecting each pair of an upper and a lower layers to the load element. Namely, the power source network is a network formed by the power supplying unit, the wiring, and the via.

Figure 1:
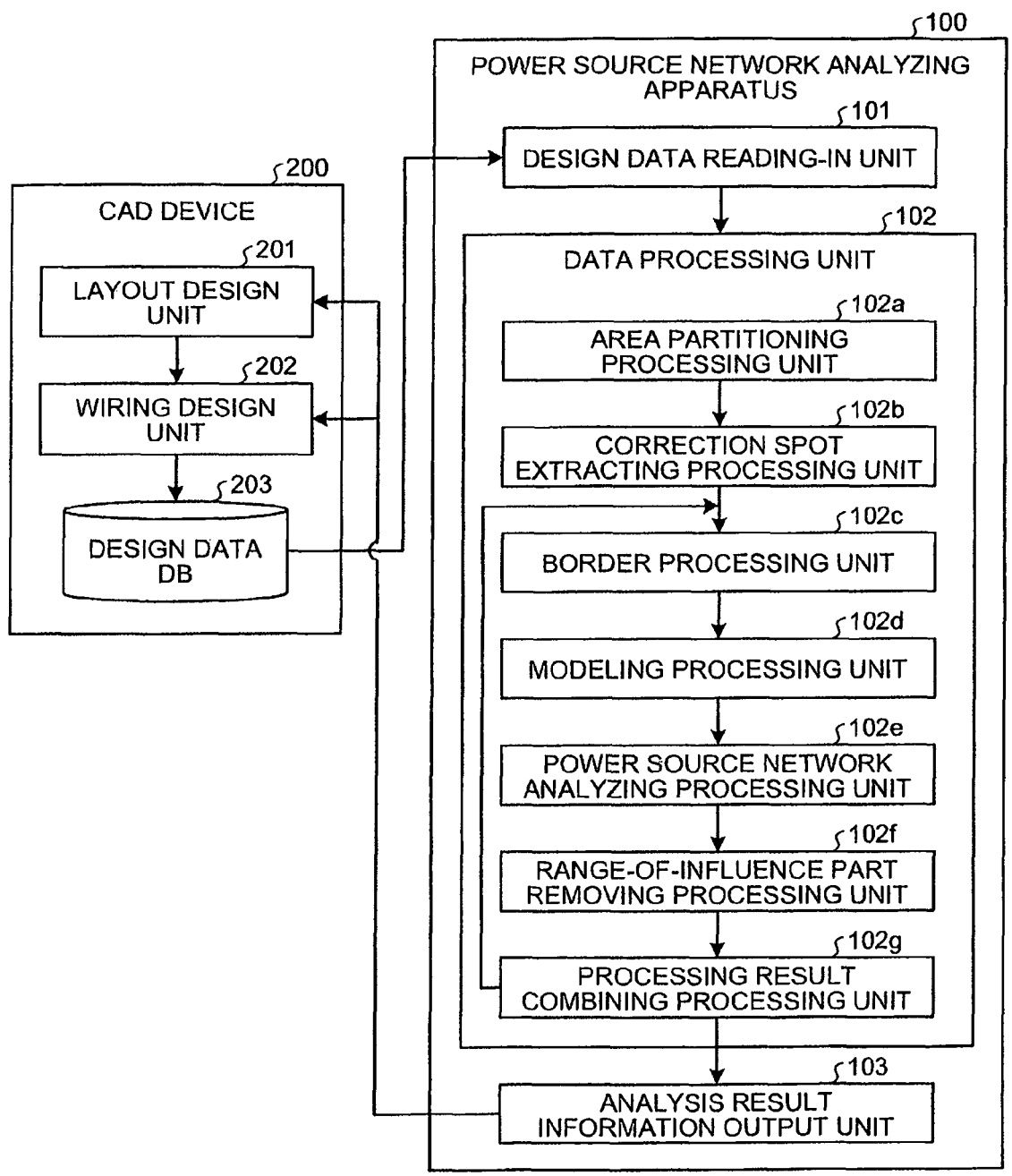
FIG. 1 is a functional block diagram of a configuration of a power source network analyzing apparatus according to an embodiment.

A configuration will firstly be described of the power source network analyzing apparatus according to the embodiment. FIG. 1 is a functional block diagram of the configuration of the power source network analyzing apparatus according to the embodiment. As shown in FIG. 1, a power source network analyzing apparatus 100 according to the embodiment includes a design data reading-in unit 101, a data processing unit 102, and an analysis result information output unit 103.

A CAD device 200 that supplies LSI design data to the power source network analyzing apparatus 100 includes a layout design unit 201 that supports layout design of each load element of the LSI, a wiring design unit 202 that supports the design of a pattern of the wiring that connects respective load elements laid out by the layout design unit 201 or connects each load element and the power source, and a design data DB (Data Base) 203 that stores the design data of the LSI designed by the layout design unit 201 and the wiring design unit 202.

The design data reading-in unit 101 of the power source network analyzing apparatus 100 is an interface that reads in the LSI design data from the design data DB 203 of the CAD device 200 and transfers the LSI design data to the data processing unit 102.

The data processing unit 102 performs the power source network analysis of the LSI based on the LSI design data transferred from the design data reading-in unit 101. The data processing unit 102 includes an area partitioning processing unit 102a, a correction spot extracting processing unit 102b, a border processing unit 102c, a modeling processing unit 102d, a power source network analyzing processing unit 102e, a range-of-influence part removing processing unit 102f, and a processing result combining processing unit 102g.

The area partitioning processing unit 102a, in other than the case of performing the power source network analysis only on a correction spot of the LSI design, establishes a power source network analysis object area of the LSI and equally partitions the power source network analysis object area according to the number or size of partitioned areas or partitions the power source network analysis object area according to a user's specification.

The correction spot extracting processing unit 102b performs processing of extracting the correction spot from the LSI design data in the case of performing the power source network analysis only on the correction spot of the LSI design.

The border processing unit 102c extracts and adds a range-of-influence part of the power source network that can electrically influence the border between the partitioned area partitioned by the area partitioning processing unit 102a or the correction spot extracted by the correction spot extracting processing unit 102b and an adjacent power source network area.

The modeling processing unit 102d performs processing of resistance modeling of the partitioned area or the correction spot with the range-of-influence part added thereto by the border processing unit 102c. The resistance modeling processing is performed using, for example, a known technology.

The power source network analyzing processing unit 102e analyzes a resistance model modeled by the modeling processing unit 102d, using, for example, a known technology of performing a matrix calculation and calculates potential of each via as a current source to the load element. Unless the potential of each via is equal to or greater than a reference value specified for each LSI, the LSI does not operate properly.

The range-of-influence part removing processing unit 102f removes results of the power source network analysis of the power source network area, adjacent to the partitioned area or the correction spot, processed by the border processing unit 102c. The processing result combining processing unit 102g integrates results of the power source network analysis of the partitioned area or the correction spot after removal by the range-of-influence part removing processing unit 102f of the results of the power source network analysis of the power source network area adjacent to the partitioned area or the correction spot into results of processing of the power source network analysis object as a whole.

The border processing unit 102c, the modeling processing unit 102d, the power source network analyzing processing unit 102e, the range-of-influence part removing processing unit 102f, and the processing result combining processing unit 102g repeat the same processing with respect to the object partitioned area or correction spot until the power source network analysis of all partitioned areas or correction spots is finished.

If the power source network analysis is finished with all object partitioned areas or correction spots, the processing result combining processing unit 102g transfers integrated results of processing of the power source network analysis object as a whole to the analysis result information output unit 103.

The analysis result information output unit 103 determines whether the results of processing of the power source network analysis object as a whole transferred from the processing result combining processing unit 102g contain the IR drop and feeds back results of the determination to the layout design unit 201 and/or the wiring design unit 202 of the CAD device 200.

The layout design unit 201 and/or the wiring design unit 202 supports correction of the design of a correction-applicable part of the LSI, based on the fed-back results of processing of the power source network analysis object as a whole. The thus corrected design data is again stored in the design data DB 203.

Figure 2:
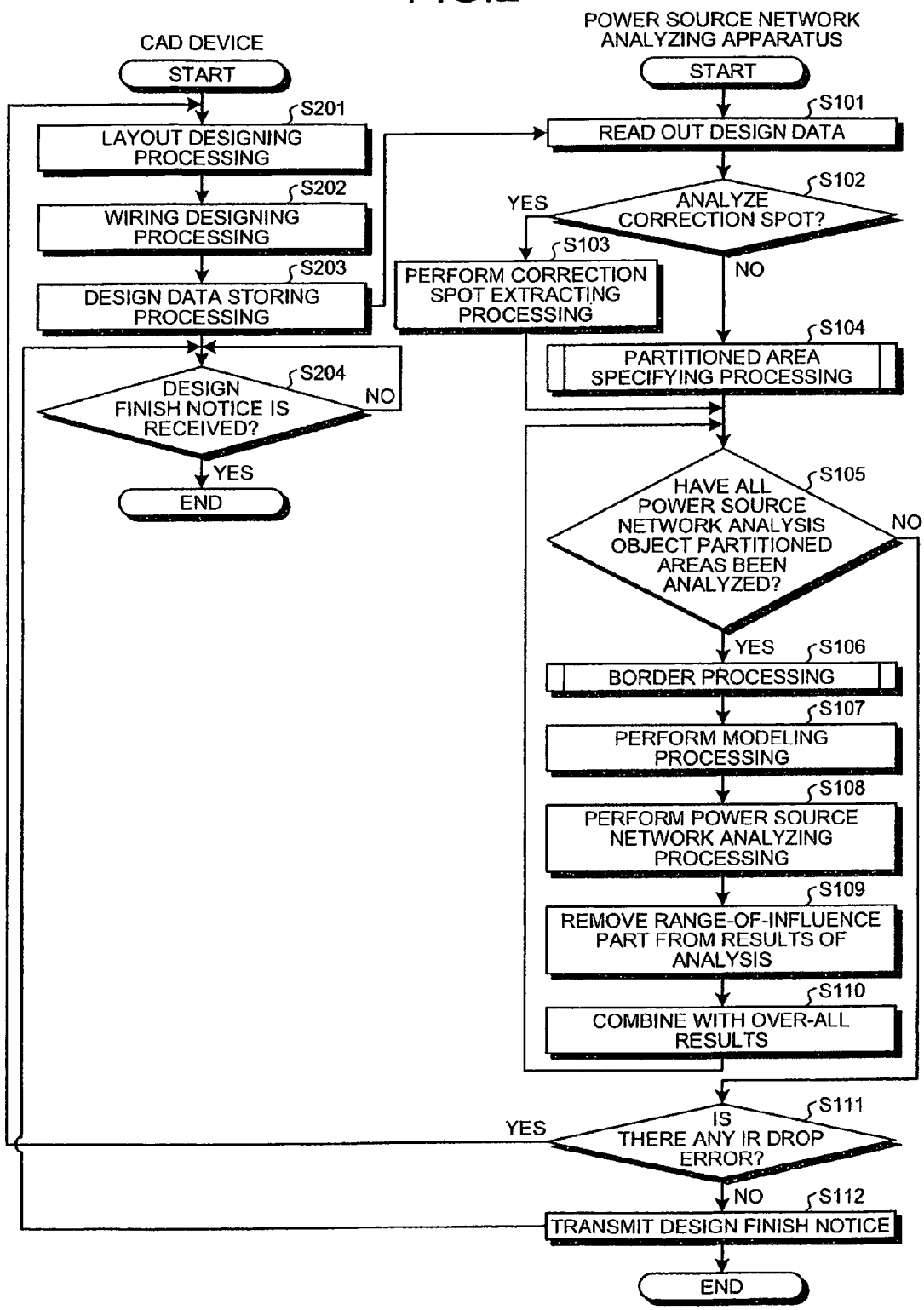
FIG. 2 is a flow chart of a power source network analyzing processing procedure.

Power source network analyzing processing will then be described that is performed by the power source network analyzing apparatus 100 shown in FIG. 1. FIG. 2 is a flowchart of a power source network analyzing processing procedure. Hereinafter, processing at the power source network analyzing apparatus 100 is referred to as power source network analyzing processing and processing at the CAD device 200 is referred to as design support processing.

As shown in FIG. 2, the layout design unit 201 of the CAD device 200 supports the layout design of the load element of the LSI (Step S201). Next, the wiring design unit 202 of the CAD device 200 supports the wiring design of the LSI (Step S202). Then, the design data DB 203 stores the design data of the LSI the design of which is supported by the layout design unit 201 and the wiring design unit 202 (Step S203).

On the other hand, at the power source network analyzing apparatus 100, firstly, the design data reading-in unit 101 reads out the design data of the LSI as an object or target of the power source network analysis from the design data DB 203 (Step S101).

Then, the area partitioning processing unit 102a of the data processing unit 102 determines whether to analyze the correction spot of the design data of the LSI. If it is determined to analyze the correction spot of the design data of the LSI (Yes at Step S102), then the flow goes to Step S103. If it is not determined to analyze the correction spot of the design data of the LSI (No at Step S102), then the flow goes to Step S104.

At Step S103, the correction spot extracting processing unit 102b extracts all the correction spots of the design data of the LSI. On the other hand, at Step S104, the area partitioning processing unit 102a, by performing partitioned area specifying processing, partitions a power source network analysis object area into power source network analysis object partitioned areas. Details of the partitioned area specifying processing will be described later with reference to FIG. 3. If Step S103 or Step S104 is finished, then the flow goes to Step S105.

At Step S105, the area partitioning processing unit 102a determines whether all power source network analysis object partitioned areas partitioned by the processing at Step S104 have been analyzed. If it is determined that all power source network analysis object partitioned areas have been analyzed (Yes at Step S105), then the flow goes to Step S106. If it is not determined that all power source network analysis object partitioned areas have been analyzed (No at Step S105), then the flow goes to Step S111.

At Step S106, the border processing unit 102c performs border processing of adding the range-of-influence part that electrically influences a partitioning border of the power source network analysis object partitioned area. Details of the border processing will be described later with reference to FIG. 4. Then, the modeling processing unit 102d prepares a resistance model based on the design data of the power source network of the power source network analysis object partitioned area (Step S107).

Then, the power source network analyzing processing unit 102e performs the power source network analyzing processing on the resistance model prepared at Step S107 (Step S108). Then, the range-of-influence part removing processing unit 102f removes the results of the power source network analysis associated with the range-of-influence part contained in the results of the power source network analysis by the processing at Step S108 and acquires the results of the power source network analysis of only the power source network analysis object partitioned area (Step S109).

Then, the processing result combining processing unit 102g combines the results of the power source network analysis of only the power source network analysis object partitioned area acquired by the processing at Step S109 with the over-all results of the power source network analysis object area (Step S110). If this processing is finished, then the flow goes to Step S105.

By sequentially performing the processing of Step S106 to Step S110 on all power source network analysis object partitioned areas, the results of the power source network analysis of the power source network analysis object area as a whole are obtained ultimately.

The processing of Step S106 to Step S110 may be performed on respective power source network analysis object partitioned areas in parallel. Like this, by performing the power source network analyzing processing of the power source network analysis object partitioned areas in parallel, the results of the power source network analysis of the power source network analysis object area as a whole may be obtained more speedily.

At Step S111, the analysis result information output unit 103 determines whether the results of the power source network analysis of the power source network analysis object area as a whole contain an IR drop error. If it is determined that the results of the power source network analysis of the power source network analysis object area as a whole contain the IR drop error (Yes at Step S111), then the CAD device re-executes the layout design processing (Step S201) and/or the wiring design processing (Step S202).

On the other hand, if it is not determined that the results of the power source network analysis of the power source network analysis object area as a whole contain the IR drop error (No at Step S111), then the flow goes to Step S112. At Step S112, the analysis result information output unit 103 transmits a design finish notice to the CAD device 200.

The CAD device 200 in receipt of the design finish notice from the analysis result information output unit 103 of the power supply network analyzing apparatus 100 terminates the design support processing (Yes at Step S204).

Figure 3:
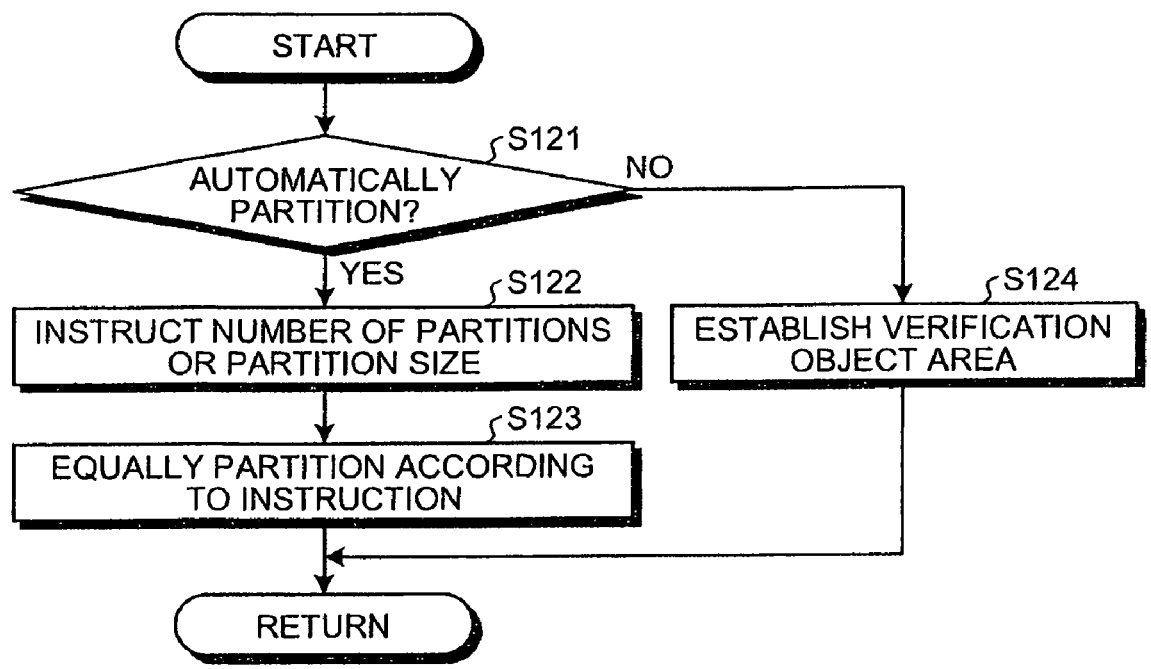
FIG. 3 is a flow chart of a partitioned area specifying processing procedure.

The partitioned area specifying processing will then be described that is shown at Step S104 of FIG. 2. FIG. 3 is a flow chart of a partitioned area specifying processing procedure. As shown in FIG. 3, firstly, the area partitioning processing unit 102a determines whether to automatically partition the power source network analysis object area, based on the user's specification (Step S121).

Next, the area partitioning processing unit 102a instructs the number of partitions or a partition size of the power source network analysis object area, based on the user's specification (Step S122). Then, the area partitioning processing unit 102a equally partitions the power source network analysis object area into the power source network analysis object partitioned areas according to the instruction of the number of partitions or the partition size of the power source network analysis object area (Step S123). On the other hand, at Step S124, the area partitioning processing unit 102a establishes a verification object area as the power source network analysis object area, based on the user's specification.

Figure 4:
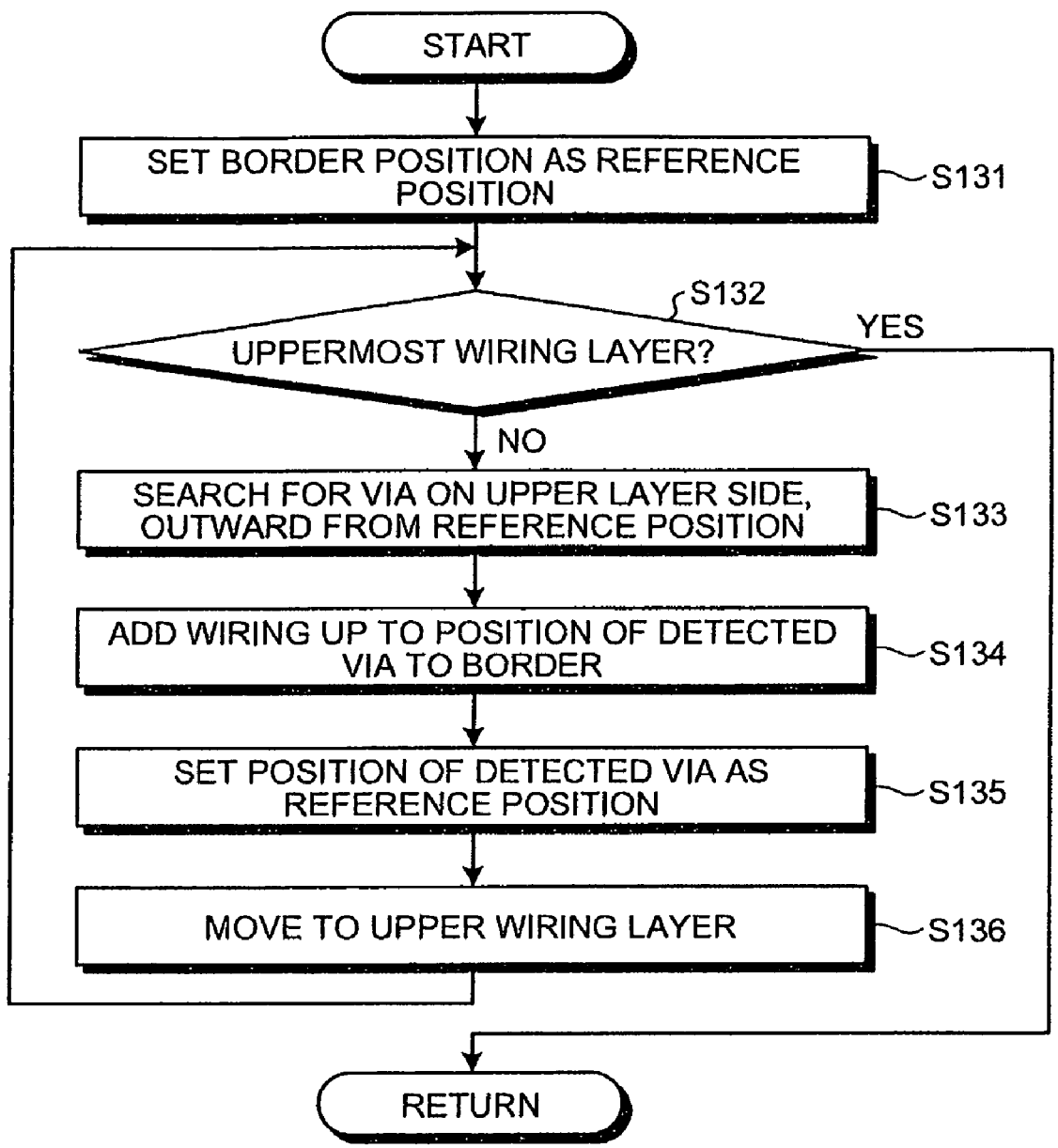
FIG. 4 is a flow chart of a border processing procedure.

The border processing will then be described that is shown at Step S106 of FIG. 2. FIG. 4 is a flow chart of a border processing procedure. As shown in FIG. 4, firstly, the border processing unit 102c sets the border position of the power source network analysis object partitioned area as a reference position (Step S131).

Next, the border processing unit 102c determines whether the wiring including the border position set as the reference position is the wiring of the uppermost wiring layer of layered structure (Step S132). If it is determined that the wiring including the border position set as the reference position is the wiring of the uppermost wiring layer of the layered structure (Yes at Step S132), then the flow goes back to the power source network analyzing processing. If it is not determined that the wiring including the border position set as the reference position is the wiring of the uppermost wiring layer of the layered structure (No at Step S132), then the flow goes to Step S133.

At Step S133, the border processing unit 102c searches for a via on the upper layer side, outside the reference position set at Step S131 (i.e., outside the power source network analysis object partitioned area). Then, the border processing unit 102c adds the wiring up to the position of the via detected at Step S133 to the border of the power source network analysis object partitioned area (Step S134).

Then, the border processing unit 102c sets the position of the via detected at Step S133 as a new reference position (Step S135). Then, the border processing unit 102c determines the wiring of the upper wiring layer, upper by one layer along the via set as the new reference position at Step S135, to be the wiring in which to search for a via (Step S136). When this processing is finished, the flow goes to Step S132.

Figure 5:
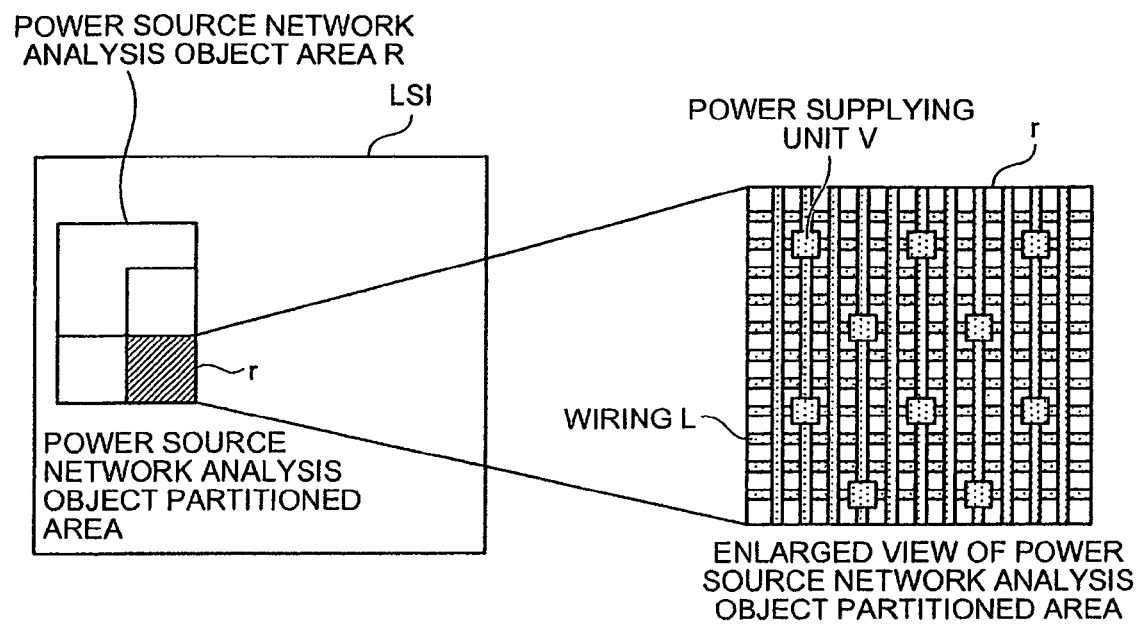
FIG. 5 is a diagram of an image of a partitioned area.

A positional relationship of the LSI, the power source network analysis object area R, and the power source network analysis object partitioned area r is as shown in FIG. 5. Enlargement visualizes that the power source network analysis object partitioned area r includes the wiring L laid out in layers and the power supplying unit V laid out at a predetermined position of the wiring L. The power supplying unit V is a part that applies voltage and supplies power to the LSI.

Figure 6A:
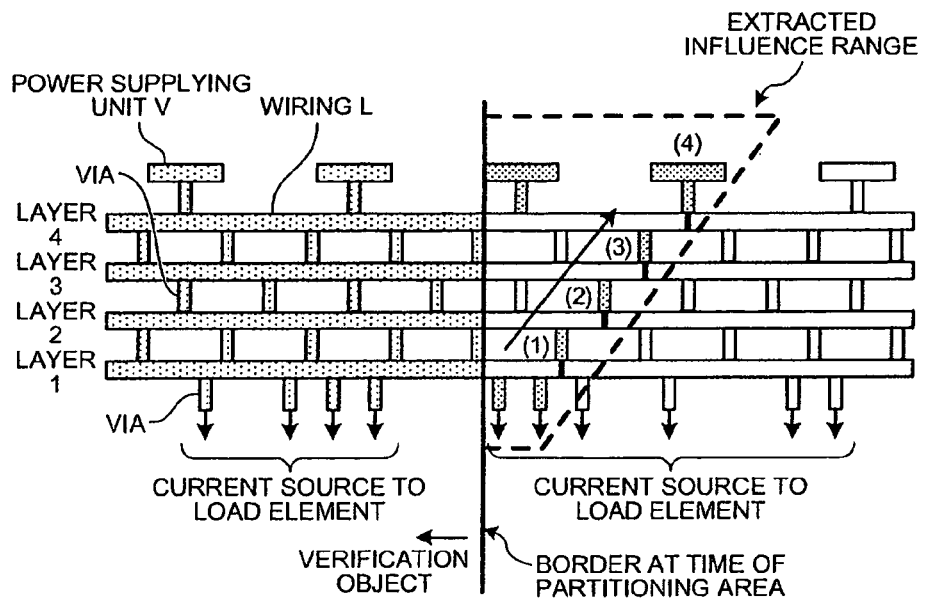
FIG. 6A is a diagram of an extraction example of a range of influence to a border of the partitioned area.
Figure 6B:
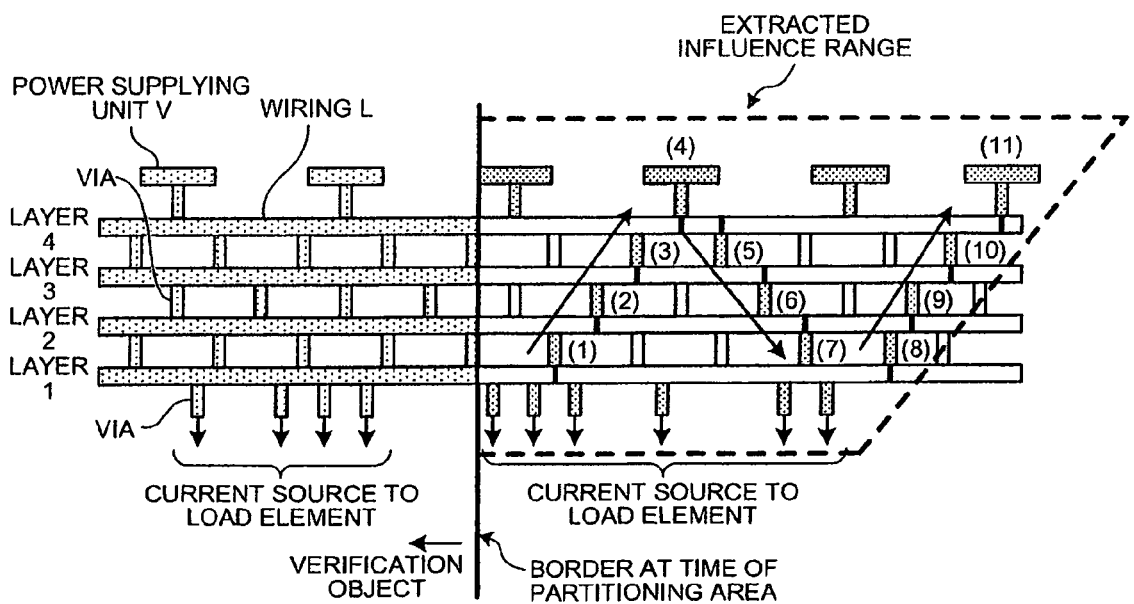
FIG. 6B is a diagram of an extraction example of the range of influence to the border of the partitioned area.

Extraction examples will then be described of the range of influence to the border of the partitioned area. FIG. 6A is a diagram of an extraction example (one of two) of the range of influence to the border of the partitioned area. FIG. 6B is a diagram of an extraction example (two of two) of the range of influence to the border of the partitioned area. FIG. 6B shows the case in which the range of influence to the boarder of the partitioned area is widely taken and the accuracy of the power source network analysis is enhanced, as compared with the case of FIG. 6A.

In FIGS. 6A and 6B, the wiring layer on the side of the current source to the load element is a lower wiring layer and the wiring layer on the side of the power supplying unit V is an upper wiring layer. The wiring L is formed in layered structure of layer 1 to layer 4. A via as a current source to the load element is connected to the underside of layer 1. The power supplying unit V as a terminal for connecting the power source to the LSI is connected to the surface side of layer 4.

Then, processing of acquiring the range of influence starting from the border of the wiring of the lowermost layer will be explained.

With respect to layer 1 of FIG. 6A, search for a via between layer 1 and layer 2 in outward direction from the border at the time of the area partitioning. Keep coordinates of the detected via (1) and divide the wiring L of layer 1 at the position of such coordinates. Connect the divided wiring L to the border. Then, acquire the via connected on the lower wiring layer side, present up to the dividing position of layer 1. Connect the acquired via to the wiring of layer 1.

With respect to layer 2 of FIG. 6A, search for a via between layer 2 and layer 3, in outward direction from the border, starting from the kept coordinates of the via (1). Then, keep coordinates of the detected via (2) and divide the wiring of layer 2 at the position of such coordinates.

Connect the divided wiring L of layer 2 to the border and acquire the via between layer 1 and layer 2 connected on the lower wiring layer (layer 1) side, present up to the dividing position of layer 2. Connect the acquired via to the wiring of layer 2. With respect to layer 3 and layer 4 as well, by performing the same processing, acquire the via (3) and the via (4) with the power supplying unit V connected thereto and connect these vias to the border. The above is the processing of acquiring the range of influence starting from the border of the wiring of the lowermost layer.

Then, the processing of acquiring the range of influence starting from the via with the power supplying unit connected thereto of the uppermost layer will be explained.

In the case of performing the analysis of further higher accuracy (FIG. 6B), with respect to layer 4 touching the via (4), search for a via between layer 3 and layer 4. Keep coordinates of the via (5) and divide the wiring of layer 4 at the position of such coordinates.

Connect the divided wiring of layer 4 to the wiring acquired by the processing heretofore and acquire the via (5) between layer 3 and layer 4 connected on the lower wiring layer (layer 3) side, present up to the dividing position of layer 4. Connect the acquired via (5) to the wiring of layer 4.

With respect to layer 3 of FIG. 6B, search for a via between layer 2 and layer 3, in outward direction from the border, starting from the coordinates of the via (5). Then, keep coordinates of the detected via (6) and divide the wiring of layer 3 at the position of such coordinates.

Further connect the divided wiring L of layer 3 to the wiring and acquire the via (6) between layer 2 and layer 3 connected on the lower wiring layer (layer 2) side, present up to the dividing position of layer 3. Connect the via (6) to the wiring of layer 3.

Repeat the above processing up to the via serving as the current source and connect the acquired wiring and via to the wiring of layer 1.

Furthermore, search for a via between layer 1 and layer 2, in outward direction from the border, starting from the acquired dividing position of layer 1. Keep coordinates of the detected via (7) and divide the wiring of layer 1 at the position of such coordinates.

Further connect the divided wiring of layer 1 to the wiring of layer 1 acquired by the processing heretofore and acquire the via serving as the current source connected on the lower wiring layer side, present up to the dividing position of layer 1. Connect the via to the wiring of layer 1. The above is the processing of acquiring the range of influence starting from the via with the power supplying unit connected thereto of the uppermost layer.

For enhanced accuracy of the power source network analysis, by beginning with the "processing of acquiring range of influence starting from border of wiring of lowermost layer" and alternately repeating the "processing of acquiring range of influence starting from via with power supplying unit connected thereto of uppermost layer" and the "processing of acquiring range of influence starting from border of wiring of lowermost layer", a wider range of influence may be extracted and the accuracy of the power source network analysis may be further enhanced. Setting of conditions of extracting the range of influence is changeable from the outside.

According to the above embodiment, by partitioning the LSI as a whole and executing the power source network analysis in parallel, the analysis may be finished within a short time. By selectively analyzing only the area desired to be analyzed of the power source network, the power source network analysis may be executed within a short time.

By automatically extracting the range of influence to the border and adding the range of influence to the border, the power source network analysis may be performed with high accuracy. Without necessity of much of the computer resources such as a memory at the time of power source network analysis, processing time may be shortened.

The capability of performing the power source network analysis partially enables achieving improvement of TAT (Turn Around Time) required for the power source network analysis and the LSI design correction and achieving increased efficiency of the LSI design.

While the above has described exemplary embodiment of the present invention, the present invention is not limited to this but may further be practiced in various different exemplary embodiments within the scope of the technical idea described in the scope according to claims. The above effect is not limited to the effect described in the exemplary embodiment.

Out of respective items of processing described in the exemplary embodiment, all or part of the items of processing described as being automatically performed may also be performed manually and conversely, all or part of the items of processing described as being manually performed may also be performed automatically through a publicly known method. Besides this, the processing procedures, the control procedures, specific designations, and information containing various data and parameters shown in the above exemplary embodiment may arbitrarily be changed except as specifically noted otherwise.

Each constituent element of each illustrated apparatus or device is function-conceptual and is not necessarily required to be physically configured as illustrated. Namely, a specific form of distribution/integration of each apparatus or device is not limited to the one illustrated and it may be configured so that all or part thereof is functionally or physically distributed or integrated, by arbitrary unit, depending on various loads and the situation of use.

Further, each processing function performed in each apparatus or device may have all or an arbitrary part thereof realized by a CPU (central processing unit) (or a microcomputer such as an MPU (micro processing unit) and an MCU (micro controller unit)) and a program analyzed and executed by the CPU (or the microcomputer such as the MPU and the MCU) or realized as hardware by a wired logic. The program analyzed and executed by the CPU can be stored in a non-transitory computer-readable recording medium.

The disclosed power source network analyzing apparatus, power source network analyzing method, and power source network analyzing program have the effect of being capable of executing the power source network analysis in parallel and being capable of analyzing within a short time. The disclosed apparatus, method, and program have the effect of being capable of executing within a short time the power source network analysis of only the area of which the analysis is desired. The disclosed apparatus, method, and program have the effect of being capable of a high-accuracy power source network analysis, hence the effect of heightening design efficiency of the integrated circuit.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A power source network analyzing apparatus comprising:
    a processor, wherein the processor is programmed to execute:
        partitioning, based on design information of an integrated circuit including a plurality of wiring layers, a power source network analysis object area of the integrated circuit into partitioned power source network analysis object areas,
        searching for a via connecting a first layer and another second layer of the plurality of wiring layers, outside a border of a partition of the partitioned power source network analysis object area in the integrated circuit and setting a position of the searched via as a reference position outside the border of the partition,
        extracting a wiring up to the reference position as a border adjacent area that electrically influences the partitioned power source network analysis object area,
        adding the border adjacent area to the partitioned power source network analysis object area,
        generating a resistance model of the partitioned power source network analysis object area with the border adjacent area added thereto; and
        performing power source network analyzing processing on the generated resistance model.

2. The power source network analyzing apparatus according to claim 1, wherein the partitioning equally partitions the power source network analysis object area of the integrated circuit into the partitioned power source network analysis object areas, based on a number of partitions or a partition size specified by a user.

3. The power source network analyzing apparatus according to claim 1, wherein further the searched via is extracted as included in the border adjacent area that electrically influences the partitioned power source network analysis object area partitioned.

4. The power source network analyzing apparatus according to claim 1, the processor is further programmed to execute:
    removing results of a power source network analysis of the border adjacent area from results of the analysis of the resistance model; and
    integrating the results of the analysis of the resistance model after removal of the results of the power source network analysis of the border adjacent area, into results of the power source network analysis of the power source network analysis object area as a whole of the integrated circuit.

5. The power source network analyzing apparatus according to claim 4, the processor is further programmed to execute:
    determining whether a voltage that is applied to a load element in the power source network analysis object area is equal to or greater than a reference value, based on the results of the power source network analysis of the power source network analysis object area as a whole of the integrated circuit integrated.

6. The power source network analyzing apparatus according to claim 5, the processor is further programmed to execute:
    notifying a computer design support device that supports design of the integrated circuit of results of determination of whether the voltage is equal to or greater than the reference value.

7. A power source network analyzing method comprising: using an apparatus for:
    partitioning, based on design information of an integrated circuit including a plurality of wiring layers, a power source network analysis object area of the integrated circuit into partitioned power source network analysis object areas;

searching for a via connecting a first layer and another second layer of the plurality of wiring layers, outside a border of a partition of the partitioned power source network analysis object area in the integrated circuit and setting a position of the searched via as a reference position outside the border of the partition;

extracting a wiring up to the reference position as a border adjacent area that electrically influences the partitioned power source network analysis object area;

adding the border adjacent area extracted to the partitioned power source network analysis object area;

generating a resistance model of the partitioned power source network analysis object area with the border adjacent area added thereto; and performing power source network analyzing processing on the generated resistance model.

8. The power source network analyzing method according to claim 7, further comprising: equally partitioning the power source network analysis object area of the integrated circuit into the partitioned power source network analysis object areas, based on a number of partitions or a partition size specified by a user.

9. The power source network analyzing method according to claim 7, further comprising: extracting the searched via as included in the border adjacent area.

10. The power source network analyzing method according to claim 7, further comprising:

removing results of a power source network analysis of the border adjacent area from results of the analysis of the resistance model; and integrating the results of the analysis of the resistance model after the removing of the results of the power source network analysis of the border adjacent area, into results of the power source network analysis of the power source network analysis object area as a whole of the integrated circuit.

11. The power source network analyzing method according to claim 10, further comprising:

determining whether a voltage that is applied to a load element in the power source network analysis object area is equal to or greater than a reference value, based on the results of the power source network analysis of the power source network analysis object area as a whole of the integrated circuit after the integrating.

12. The power source network analyzing method according to claim 11, further comprising:

notifying a computer design support device that supports design of the integrated circuit of results of determination of whether the voltage is equal to or greater than the reference value.

13. A power source network analyzing program product including a non-transitory computer-readable recording medium that stores therein a computer program that causes a computer to execute:

partitioning, based on design information of an integrated circuit, a power source network analysis object area of the integrated circuit into partitioned power source network analysis object areas;

searching for a via connecting a first layer and another second layer of the plurality of wiring layers, outside a border of a partition of the partitioned power source network analysis object area in the integrated circuit and setting a position of the searched via as a reference position outside the border of the partition;

extracting a wiring up to the reference position as a border adjacent area that electrically influences the partitioned power source network analysis object area;

adding the border adjacent area extracted to the partitioned power source network analysis object area;

generating a resistance model of the partitioned power source network analysis object area with the border adjacent area added thereto; and performing power source network analyzing processing on the generated resistance model.

14. The power source network analyzing program product according to claim 13, further comprising: equally partitioning the power source network analysis object area of the integrated circuit into the partitioned power source network analysis object areas, based on a number of partitions or a partition size specified by a user.

15. The power source network analyzing program product according to claim 13, further comprising: extracting the searched via as included in the border adjacent area.

16. The power source network analyzing program product according to claim 13, further comprising:

removing results of a power source network analysis of the border adjacent area from results of the analysis of the resistance model; and integrating the results of the analysis of the resistance model after the removing of the results of the power source network analysis of the border adjacent area, into results of the power source network analysis of the power source network analysis object area as a whole of the integrated circuit.

17. The power source network analyzing program product according to claim 16, further comprising:

determining whether a voltage that is applied to a load element in the power source network analysis object area is equal to or greater than a reference value, based on the results of the power source network analysis of the power source network analysis object area as a whole of the integrated circuit after the integrating.

18. The power source network analyzing program product according to claim 17, further comprising:

notifying a computer design support device that supports design of the integrated circuit of results of determination of whether the voltage is equal to or greater than the reference value.

* * * * *